United States Patent
Ivanov et al.

(10) Patent No.: US 8,493,051 B2
(45) Date of Patent: Jul. 23, 2013

(54) FAST-SETTLING PRECISION VOLTAGE FOLLOWER CIRCUIT AND METHOD

(75) Inventors: Vadim V. Ivanov, Tucson, AZ (US); Harish Venkataraman, Wylie, TX (US); Susan A. Curtis, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 13/200,845

(22) Filed: Oct. 3, 2011

(65) Prior Publication Data
US 2013/0082676 A1    Apr. 4, 2013

(51) Int. Cl.
*G05F 3/16* (2006.01)
*H03F 3/26* (2006.01)
*H03F 3/45* (2006.01)

(52) U.S. Cl.
USPC ............................. 323/316; 330/267; 330/254

(58) Field of Classification Search
USPC ................. 323/216, 217, 313–317, 303, 300, 323/281, 282, 271, 299; 327/76; 330/269, 330/264, 267, 268, 277, 261, 310, 253, 255, 330/259, 260
See application file for complete search history.

(56) References Cited

U.S. PATENT DOCUMENTS 6,052,028 A * 4/2000 Heaton ........................ 330/263
7,633,280 B2 12/2009 Ivanov et al. ................. 323/326

* cited by examiner

*Primary Examiner* — Timothy J Dole
*Assistant Examiner* — Carlos Rivera-Perez
(74) *Attorney, Agent, or Firm* — Alan A. R. Cooper; Wade J. Brady, III; Frederick J. Telecky, Jr.

(57) ABSTRACT

A voltage follower circuit including an input stage for generating a difference between the input signal and the output signal. An output circuit receiving the first signal and producing the output signal. A slew boost circuit includes a first transistor having a control electrode for receiving the input signal, a first electrode coupled to a first current source, and a second electrode coupled to a first supply voltage, a second transistor having a control electrode coupled to the first electrode of the first transistor, a first electrode coupled to the first signal, and a second electrode coupled to the first supply voltage, and a third transistor having a control electrode coupled to the first electrode of the first transistor, a first electrode coupled to the first signal, and a second electrode coupled to a second supply voltage.

14 Claims, 2 Drawing Sheets

US 8,493,051 B2

FAST-SETTLING PRECISION VOLTAGE FOLLOWER CIRCUIT AND METHOD

BACKGROUND OF THE INVENTION

The present invention relates generally to fast-settling precision voltage follower circuits for driving large capacitive loads, and more particularly to a fast-settling precision voltage follower circuit that is suitable for applying a reference voltage input to the back panel conductor of an LCD panel.

The back side conductor of an ordinary LCD panel should be maintained at an accurate, constant voltage since color and intensity of the image pixels are determined by the voltage between the back side conductor and any particular front pixel electrode. The capacitance of the back panel can be up to 15-20 nanofarads, depending on the panel size. However, if the LCD screen has capacitively coupled sensors on it which are used for touch sensing, the voltage between any particular front pixel electrode and the backside conductor must be rapidly switched to accommodate for different modes of sensing, while continuing to maintain the present image on the LCD screen, to avoid any visual effects or "artifacts" from being caused by the rapid switching. For example, the settling time for 5 volt steps in the front pixel electrode voltage (relative to the voltage of the back side conductor) with 1 millivolt accuracy should be less than approximately 2 picoseconds.

Referring to Prior Art FIG. 1, a conventional two-stage voltage follower amplifier 1 includes a differential input stage including P-channel input transistors MP1 and MP2 having their sources coupled to one terminal of a tail current source J0, the other terminal of which is connected to $V_{DD}$. The gate of input transistor MP1 is connected by conductor 2 to receive an input voltage $V_{IN}$. $V_{IN}$ typically is the output of a DAC, and when voltage follower amplifier 1 is used in an LCD display system, the signal is used as an input to the display driving circuitry (not shown). There may be large, very fast changes in the value of $V_{IN}$, and in some applications the voltage follower amplifier needs to be able to respond very rapidly to such large, fast changes of $V_{IN}$. For some LCD driver applications, the voltage follower needs to drive a very large capacitive load and nevertheless be able to cause the actual value of $V_{OUT}$ to settle very rapidly to within a millivolt of the desired "steady-state" value of $V_{OUT}$.

In FIG. 1, the gate of input transistor MP2 is coupled to output conductor 9. The drain of input transistor MP1 is connected by conductor 3 to the junction between N-channel cascode transistor MN3 and N-channel transistor MN4. The drain of input transistor MP2 is connected by conductor 4 to the junction between N-channel cascode transistor MN1 and transistor MN2. The sources of transistors MN2 and MN4 are connected to $V_{SS}$. The gates of cascode transistors MN1 and MN3 are connected to a voltage source V0. The gates of transistors MN2 and MN4 are connected by conductor 5 to the drain of transistor MN1 and to one terminal of current source I1, the other terminal of which is connected to $V_{DD}$. The drain of cascode transistor MN3 is connected by conductor 8 to the gate of a N-channel pull-down transistor MN5, one terminal of a compensation capacitor C2, and one terminal of a conventional class AB output circuit.

The source of pull-down transistor MN5 is connected to $V_{SS}$ and its drain is connected by output conductor 9 to one terminal of a load capacitance $C_{LOAD}$, the drain of a P-channel pull-up transistor MP5, the other terminal of capacitor C2, and one terminal of a compensation capacitor C1. The source of pull-up transistor MP5 is connected to $V_{DD}$, and its gate is connected by conductor 6 to the other terminal of compensation capacitor C1, to the other terminal of class AB circuit 7, and to one terminal of a current source I2, the other terminal of which is connected to $V_{DD}$.

Due to the highly capacitive load $C_{LOAD}$, the basic high-speed capability of voltage follower amplifier 1 needs to be significantly reduced by compensation capacitance to keep it stable. Such compensation is achieved in two-stage voltage follower 1 by means of compensation capacitors C1 and C2. The capacitance of compensation capacitors C1 and C2 typically each may be roughly a few picofarads. In practice, compensation capacitors C1 and C2 should limit the bandwidth of voltage follower amplifier 1 to an amount below 100 kHz. That results in the output voltage $V_{OUT}$ of voltage follower amplifier 1 having a settling time in the range of roughly 30-40 picoseconds or less. Although the operating speed of a standard LCD driver is not an issue because its back panel voltage is constant, the conventional two-stage voltage follower amplifier architecture shown in Prior Art FIG. 1 can not provide the short settling times required for a capacitive touch screen application in which there would be very fast, large (e.g., 5 volt) transitions or "steps" of the input voltage $V_{IN}$.

Various current gain boosted follower circuits are known in the art. One such current gain boosted follower circuit is disclosed as the output stage section 10C together with transistor MN7 in FIG. 2 of commonly assigned U.S. Pat. No. 7,633,280 "Low Dropout Voltage Regulator with Instant Load Regulation and Method" issued to Ivanov et al. on Dec. 15, 2009.

Thus, there is an unmet need for a very fast-settling precision voltage follower circuit and method.

There also is an unmet need for a precision voltage follower circuit and method capable of providing a very fast-settling output voltage while driving a very large capacitive load.

There also is an unmet need for circuitry and a method to provide very fast-settling of the output voltage of a precision voltage follower circuit without substantially increasing its power consumption.

There also is an unmet need for a very fast-settling precision voltage follower circuit and method capable of providing the fast mode switching operation needed for a back panel driver of a capacitive touch screen system.

SUMMARY OF THE INVENTION

It is an object of the invention to provide a very fast-settling precision voltage follower circuit and method.

It is another object of the invention to provide a precision voltage follower circuit and method which provide a very fast-settling output voltage while driving a very large capacitive load.

It is another object to provide circuitry and a method for achieving very fast-settling of the output voltage of a precision voltage follower circuit without substantially increasing its power consumption.

It is another object of the invention to provide a very fast-settling precision voltage follower circuit and method capable of providing the fast mode switching operation needed for a back panel driver of a capacitive touch screen system.

Briefly described, and in accordance with one embodiment, the present invention provides a voltage follower circuit including an input stage (17) having a first input receiving an input signal ($V_{IN}$) and a second input receiving an output signal ($V_{OUT}$), the input stage generating a first signal ($V_F$) representing a difference between the input signal and the output signal. An output circuit (12) has an input receiving the first signal ($V_F$) and produces the output signal. A slew boost circuit (22) includes a first transistor (M0) having a control electrode for receiving the input signal, a first electrode coupled to a first current source (I3), and a second electrode coupled to a first supply voltage ($V_{DD}$), a second transistor (M1) having a control electrode coupled to the first electrode of the first transistor, a first electrode coupled to the first signal, and a second electrode coupled to the first supply voltage, and a third transistor (M2) having a control electrode coupled to the first electrode of the first transistor, a first electrode coupled to the first signal, and a second electrode coupled to a second supply voltage ($V_{SS}$).

In one embodiment, the invention provides a voltage follower circuit (30) for producing an output signal ($V_{OUT}$) which follows an input signal ($V_{IN}$), including an input stage (17) having a first input (2) for receiving the input signal ($V_{IN}$), and a second input (9) for receiving the output signal ($V_{OUT}$), the input stage (17) generating a first signal ($V_F$) indicative of a difference between the input signal ($V_{IN}$) and the output signal ($V_{OUT}$). An output circuit (12) has an input (6) and an output (9) on which the output signal ($V_{OUT}$) is produced. A slew boost circuit (22) includes a first transistor (M0) having a control electrode for receiving the input signal ($V_{IN}$), a first electrode coupled to a first current source (I3), and a second electrode coupled to the second supply voltage ($V_{DD}$). A second transistor (M1) has a control electrode coupled to the first electrode of the first transistor (M0), a first electrode coupled to a first conductor (6) conducting the first signal ($V_F$), and a second electrode coupled to the second supply voltage ($V_{DD}$). A third transistor (M2) has a control electrode coupled to the first electrode of the first transistor (M0), a first electrode coupled to the first conductor (6) conducting the first signal ($V_F$), and a second electrode coupled to the first supply voltage ($V_{SS}$).

In one embodiment, the output circuit includes a current gain boost circuit (12) including a follower transistor (MP3) having a control electrode coupled to receive the first signal ($V_F$) and a first electrode for receiving the output signal ($V_{OUT}$), a first resistive element (R2) coupled between the second electrode of the follower transistor (MP3) and a first supply voltage ($V_{SS}$), a cascode transistor (MN7) having a control electrode coupled to receive a first bias voltage (V1), a first electrode coupled to the second electrode of the follower transistor (MP3) and a control electrode of a pull-down transistor (MN8), and a second electrode coupled to a control electrode of a pull-up transistor (MP8) and a second resistive device (R1). The pull-up transistor (MP8) has a first electrode coupled to a second supply voltage ($V_{DD}$) and a second electrode coupled to an output conductor (8) connecting the output signal ($V_{OUT}$).

In one embodiment, the input stage (17) includes a first input transistor (MP1) having a first electrode connected to a tail current source (I0), a control electrode coupled to receive the input signal ($V_{IN}$), and a second electrode (3) coupled to a folded cascode circuit including fourth (MN2), fifth (MN1), sixth (MN4), and seventh (MN3) transistors. A first electrode of each of the fourth (MN2) and sixth (MN4) transistors is coupled to the first supply voltage ($V_{SS}$), and a drain of the fourth transistor (MN2) is coupled to the second electrode (3) of the first input transistor (MP1) and a source of the fifth transistor (MN1). The input stage (17) also includes a second input transistor (MP2) having a first electrode coupled to the tail current source (I0), a control electrode coupled to the output signal ($V_{OUT}$), and a second electrode (4) coupled to a second electrode of the sixth transistor (MN4) and a first electrode of the seventh transistor (MN3). Control electrodes of the fifth (MN1) and seventh (MN3) transistors are connected to a second bias voltage (V0). Control electrodes of the fourth (MN2) and sixth (MN4) transistors are coupled to a second electrode of the fifth transistor (MN) and a second current source (I1). A second electrode of the seventh transistor (MN3) is coupled by the first conductor (6) to the first signal ($V_F$) and a third current source (I2).

In one embodiment, the transistors are MOS (metal-oxide-semiconductor) transistors, the first electrodes are sources, the second electrodes are drains, and the control electrodes are gates. The follower transistor (MP3), the pull-up transistor (MP8), and the first (M0), second (M1), and third (M2) transistors are P-channel transistors, and the cascode transistor (MN7) and the pull-down transistor (MN8) are N-channel transistors.

In one embodiment, the transistors are MOS (metal-oxide-semiconductor) transistors, the first electrodes are sources, the second electrodes are drains, and the control electrodes are gates, and the first (MP1) and second (MP2) input transistors are P-channel transistors and the fourth (MN2), fifth (MN1), sixth (MN4), and seventh (MN3) transistors are N-channel transistors.

In one embodiment, the slew boost circuit (22) operates to shift the input signal ($V_{IN}$) and apply the shifted input signal (21) to turn on one or the other of the second transistor (M1) and the third transistor (M2), depending on whether the fast transition is positive-going or negative-going, the second transistor (M1) having a conductivity type opposite to that of the third transistor (M2), to cause the turned on second (M1) or third transistor (M2) to rapidly drive the first signal ($V_F$) to an intermediate level close to a steady-state value of the first signal ($V_F$) corresponding to a steady state value of the input signal ($V_{IN}$) at the end of the fast transition, and to turn off the turned on first (M1) or second (M2) transistor when the first signal ($V_F$) reaches the intermediate level.

In one embodiment, the slew boost circuit (22) operates to shift the input signal ($V_{IN}$) by applying it to a gate of the first transistor (M0) to produce the shifted input signal (21) on gates of the second (M1) and third (M2) transistors. If the first signal ($V_F$) undergoes a fast, positive-going transition, that turns the follower transistor (MP3) off, the first resistive element (R2) causes the pull-down transistor (MN8) to turn off and also causes the cascode transistor (MN8) to turn on harder so as to turn the pull-up transistor (MP8) on and rapidly increase the voltage of the output signal ($V_{OUT}$). If the first signal ($V_F$) undergoes a fast, negative-going transition, that turns the follower transistor (MP3) on, the first resistive element (R2) causes the pull-down transistor (MN8) to turn on and also reduces the amount of current in the cascode transistor (MN8) so as to turn off the pull-up transistor (MP8) and rapidly decrease the voltage of the output signal ($V_{OUT}$).

In one embodiment, the first resistive element includes a resistor (R2) and the second resistive element includes a pull-up resistor (R1).

In one embodiment, the invention provides method for providing fast settling of an output signal ($V_{OUT}$) of a voltage follower circuit (30), the method including providing a differential input stage (17) having a first input (2) for receiving an input signal ($V_{IN}$), and a second input (9) for receiving the output signal ($V_{OUT}$), the input stage (17) generating a first signal ($V_F$) indicative of a difference between the input signal ($V_{IN}$) and the output signal ($V_{OUT}$), and also providing an output circuit (12) including an input (6) coupled to receive the first signal ($V_F$) and an output conductor (9) for conducting the output signal ($V_{OUT}$); applying a fast transition of the input signal ($V_{IN}$) to both the first input (2) of the differential input stage (17) and an input of a slew boost circuit (22) having an output (6) coupled to the output (6) of the differential input stage (17); operating the slew boost circuit (22) to shift the input signal ($V_{IN}$) and apply the shifted input signal (21) to turn on one or the other of a first transistor (M1) and a second transistor (M2), depending on whether the fast transition is positive-going or negative-going, the first transistor (M1) having a conductivity type opposite to that of the second transistor (M2), to cause the turned on first (M1) or second transistor (M2) to rapidly drive the first signal ($V_F$) to an intermediate level close to a steady-state value of the first signal ($V_F$) corresponding to a steady-state value of the input signal ($V_{IN}$) at the end of the fast transition, and to turn off the turned on first (M1) or second (M2) transistor when the first signal ($V_F$) reaches the intermediate level; and operating the differential input stage (17) to drive the first signal ($V_F$) from the intermediate level to a steady state value corresponding to a value of the input signal ($V_{IN}$) at the end of the fast transition.

In one embodiment, the slew boost circuit (22) includes an N-channel input transistor (M0), the first transistor (M1) is a N-channel transistor and the second transistor (M2) is a P-channel transistor, and the method includes operating the slew boost circuit (22) to shift the input signal ($V_{IN}$) by applying it to a gate of the N-channel input transistor (M0) to produce the shifted input signal (21) on gates of the first (M1) and second (M2) transistors and on one terminal of a current source (I3).

In one embodiment, if the first signal ($V_F$) 3 undergoes a fast, positive-going transition, the method includes turning the follower transistor (MP3) off to cause a voltage developed across the first resistive element (R2) to rapidly decrease, turning the pull-down transistor (MN8) off in response to the decreased voltage across the first resistive element (R2), turning the cascode transistor (MN7) on harder in response to the decreased voltage across the first resistive element (R2), turning on the pull-up transistor (MP8) in response to increased current through the cascode transistor (MN7), and rapidly increasing the voltage of the output signal ($V_{OUT}$) in response to increased current through the pull-up transistor (MP8).

In one embodiment, if the first signal ($V_F$) 3 undergoes a fast, negative-going transition, the method includes turning the follower transistor (MP3) on to cause a voltage developed across the first resistive element (R2) to rapidly increase, turning the pull-down transistor (MN8) on in response to the increased voltage across the first resistive element (R2), reducing current through the cascode transistor (MN7) in response to the increased voltage across the first resistive element (R2), turning the pull-up transistor (MP8) off in response to decreased current through the cascode transistor (MN7), and rapidly decreasing the voltage of the output signal ($V_{OUT}$) in response to increased current through the pull-down transistor (MN8).

In one embodiment, the method includes producing the first signal ($V_F$) by means of a folded cascode circuit in the differential input stage (17).

In one embodiment, the invention provides a voltage follower circuit (30) for providing fast settling of an output signal ($V_{OUT}$) of a voltage follower circuit (30), including a differential input stage (17) having a first input (2) for receiving an input signal ($V_{IN}$), and a second input (9) for receiving the output signal ($V_{OUT}$), the input stage (17) generating a first signal ($V_F$) indicative of a difference between the input signal ($V_{IN}$) and the output signal ($V_{OUT}$), and a current gain boosted follower circuit (12) including an input (6) coupled to receive the first signal ($V_F$) and an output conductor (9) for conducting the output signal ($V_{OUT}$); slew boost means (22) having an input (2) coupled to the input of the differential input stage (17) and an output (6) coupled to the output (6) of the differential input stage (17); means (M0) in the slew boost means (22) for shifting the input signal ($V_{IN}$) and applying the shifted input signal (21) to turn on one or the other of a first transistor (M1) and a second transistor (M2), depending on whether the fast transition is positive-going or negative-going, the first transistor (M1) having a conductivity type opposite to that of the second transistor (M2), and for causing the turned on first (M1) or second transistor (M2) to rapidly drive the first signal ($V_F$) to an intermediate level close to a steady-state value of the first signal ($V_F$) corresponding to a steady state value of the input signal ($V_{IN}$) at the end of the fast transition, and for turning off the turned on first (M1) or second (M2) transistor when the first signal ($V_F$) reaches the intermediate level; and wherein the differential input stage (17) drives the first signal ($V_F$) from the intermediate level to a steady state value corresponding to a value of the input signal ($V_{IN}$) at the end of the fast transition.

DETAILED DESCRIPTION OF THE PREFERRED EMBODIMENTS

Figure 2:
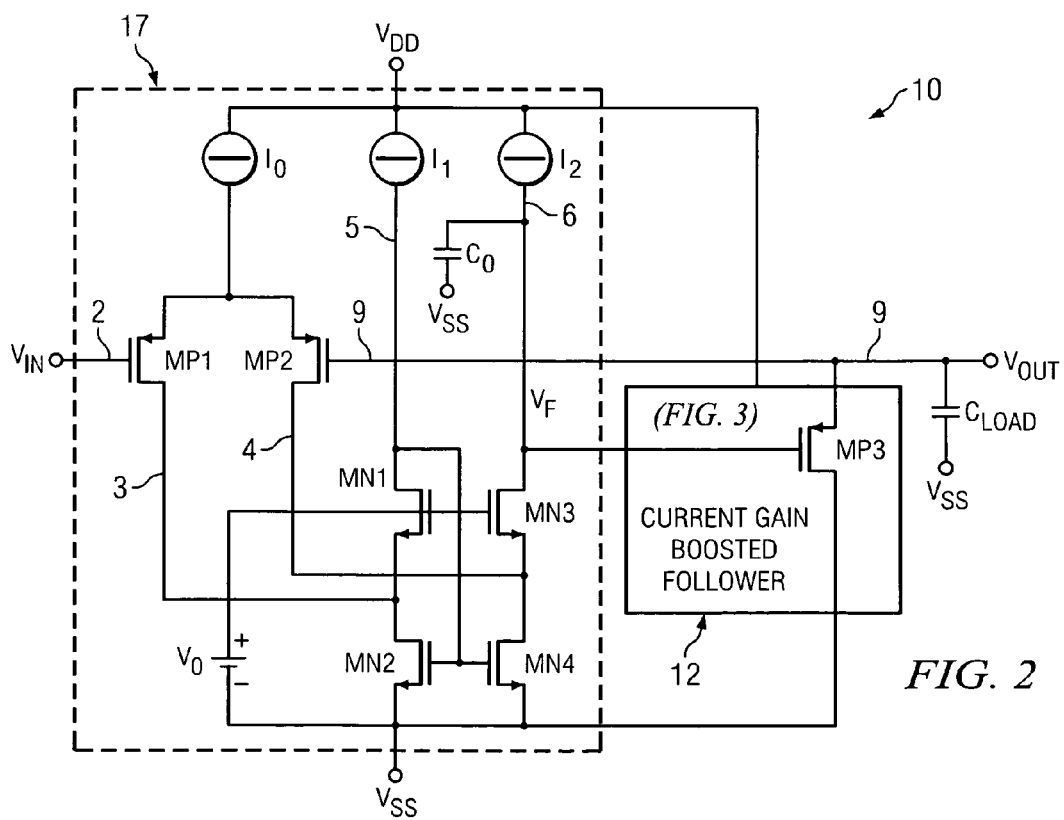
FIG. 2 is a schematic diagram of a single stage amplifier which can be used as a voltage follower circuit.

FIG. 2 is a schematic diagram of a single stage voltage follower amplifier 10. In FIG. 2, voltage follower amplifier circuit 10 includes a differential input stage 17 including P-channel input transistors MP1 and MP2 having their sources coupled to one terminal of a tail current source I0, the other terminal of which is connected to $V_{DD}$. The gate of input transistor MP1 is connected by conductor 2 to receive an input voltage $V_{IN}$. The gate of input transistor MP2 is connected to the output signal $V_{OUT}$ on output conductor 9. The drain of input transistor MP1 is connected by conductor 3 to the junction between N-channel transistor MN2 and N-channel cascode transistor MN1. The drain of input transistor MP2 is connected by conductor 4 to the junction between N-channel transistor MN4 and N-channel cascode transistor MN3. The sources of transistors MN2 and MN4 are connected to $V_{SS}$. The gates of cascode transistors MN1 and MN3 are connected to a voltage source V0. The gates of lower transistors MN2 and MN4 are connected by conductor 5 to the drain of cascode transistor MN1 and to one terminal of current source I1, the other terminal of which is connected to $V_{DD}$. The drain of cascode transistor MN3 is connected by conductor 6 to the input of a current gain boosted follower circuit 12, compensation capacitor C0 (which may be roughly 1 picofarad), and one terminal of a current source I2, the other terminal of which is connected to $V_{DD}$. Current gain boosted follower circuit 12, details of which are shown in FIG. 3, is coupled between output conductor 9 and $V_{SS}$.

The circuit shown FIG. 2 needs the compensation capacitor C0, but it unacceptably limits the slew rate for applications which require a large load capacitance to be driven by voltage follower amplifier 10 and which also require a fast response to a large, very fast step in $V_{IN}$. But the slew rate of voltage follower 10 during a large (e.g., 5 volt) transition of $V_{IN}$ is still limited by the relationship $dV_{OUT}/dt = I0/C0$ where C0 is the compensation capacitance coupled to $V_F$ conductor 6 and I0 is the tail current flowing into the common source connection between input transistors MP1 and MP2.

Figures 3, 4:
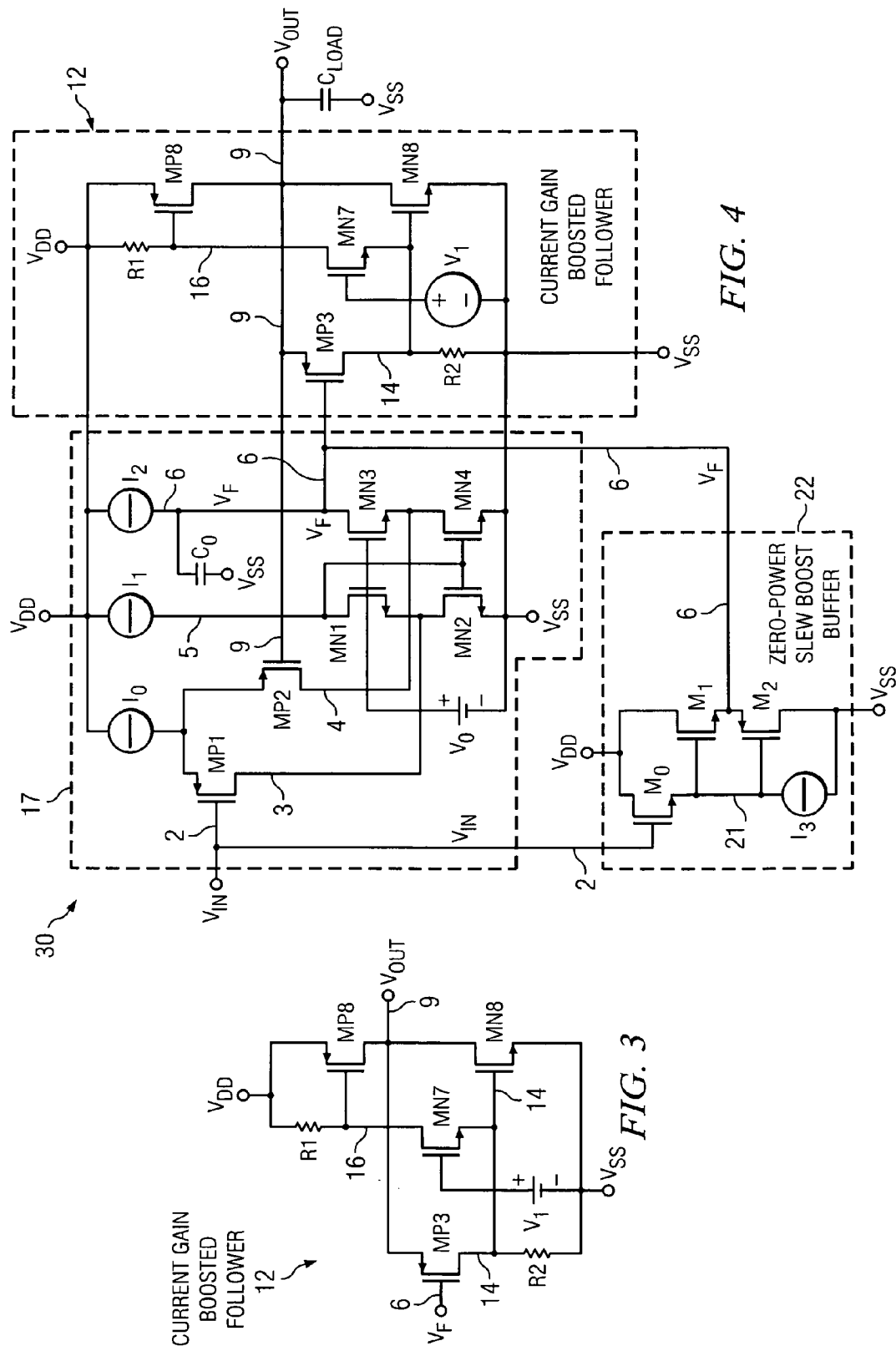
FIG. 3 is a schematic diagram of a prior art current gain boosted follower circuit used in block 12 of FIG. 2.
FIG. 4 a schematic diagram of a voltage follower amplifier.

Referring next to FIG. 3, current gain boosted follower circuit 12 includes a P-channel source follower transistor MP3 having a gate which receives a voltage $V_F$ on conductor 6. The source of follower transistor MP3 is connected by output conductor 9 to the drain of a P-channel pull-up transistor MP8 and the drain of a N-channel pull-down transistor MN8. The source of pull-up transistor MP8 is connected to $V_{DD}$, and the source of pull-down transistor MN8 is connected to $V_{SS}$. The gate of pull-up transistor MP8 is connected by conductor 16 to one terminal of a pull-up resistor R1 and the drain of a N-channel cascode transistor MN7. The other terminal of pull-up resistor R1 is connected to $V_{DD}$. The source of cascode transistor MN7 is connected by conductor 14 to the gate of pull-down transistor MN8, the drain of source follower transistor MP3, and one terminal of a pull-down resistor R2, the other terminal of which is connected to $V_{SS}$. The source of pull-down transistor MN8 is connected to $V_{SS}$. The gate of cascode transistor MN7 is connected to the (+) terminal of a voltage source V1 having its (−) terminal connected to $V_{SS}$.

Current gain boosted follower circuit 12 of FIG. 3 is similar to, but also significantly different from, the output circuitry 10C together with N-channel transistor MN7 as disclosed in FIG. 2 of the above mentioned U.S. Pat. No. 7,633,280 "Low Dropout Voltage Regulator with Instant Load Regulation and Method". However, current gain boosted follower 12 of FIG. 3 uses resistor R2 instead of the N-channel transistor MN7 shown in the '280 patent, and this difference makes current gain boosted follower 12 in FIG. 3 significantly more stable than the circuitry including transistor MN7 and output circuitry 10C shown in the '280 patent. This is in contradistinction to the use of the drain of transistor MN7 (or a current source current source) connected to the drain of the source follower transistor (MP3 in FIG. 3), because of high impedance that would occur at the drain of the source follower transistor as a result of using the above mentioned transistor MN7 in the '280 patent, and the high impedance would usually necessitate use of a costly compensation capacitor on the drain node.

Transistor MP3 functions as a source follower, so the voltage of its source follows the voltage $V_F$ applied to its gate. If $V_F$ undergoes a fast positive-going transition, then the source voltage $V_{OUT}$ of transistor MP3 rapidly follows its gate voltage $V_F$ in a fast, positive-going transition. If more pull-up driving capability is needed to drive a load (not shown), then, as the source voltage $V_{OUT}$ of MP3 goes high, the drain voltage of MP3 goes low and cascode transistor MN7, which acts as a common gate amplifier, goes to a low level. This turns pull-up transistor MP8 on to help drive the load, if necessary.

Conversely, if $V_F$ undergoes a fast negative-going transition, the source voltage $V_{OUT}$ of transistor MP3 rapidly follows its gate voltage $V_F$ in a fast, negative-going transition to a low level. In this case, the drain of transistor MP3 goes to a high level that turns on pull-down transistor MN8 to help drive the load, if necessary.

Referring again to FIG. 2, the use of current gain boosted follower circuit 12 of FIG. 3 in voltage follower amplifier 10 has the effect of substantially increasing the conductance voltage of follower amplifier 10. No voltage gain is achieved by source follower transistor MP3, but the use of source follower transistor MP3 along with pull-down transistor MN8 as shown in FIG. 2 boosts the output conductance of voltage follower amplifier 10 by an additional 30 to 40 dB. This results in lower output impedance at output conductor 9 and overcomes the fact that no voltage gain is achieved by source follower transistor MP3.

Referring to FIG. 4, a fast-settling voltage follower amplifier 30 includes the basic input stage 17 of FIG. 2 and the current gain boosted follower 12 of FIG. 3, and further includes a slew boost buffer circuit 22 functioning as a feed-forward circuit which bypasses input stage 17 and operates to provide fast charging and fast discharging i.e., fast settling, of the voltage $V_F$ on conductor 6. Voltage follower amplifier 30 includes input stage 17, which may be essentially the same as in previously described FIG. 2. As in FIG. 2, input stage 17 receives input signal $V_{IN}$ on input conductor 2, and $V_{IN}$ may be the output of a DAC (digital-to-analog converter). When voltage follower amplifier 30 is used in an LCD display system (not shown), $V_{IN}$ may be used as an input to the display driver circuitry. There may be very large, fast transitions in the value of $V_{IN}$, and for some applications voltage follower amplifier 30 needs to be able to respond very rapidly to such large, fast transitions. For example, voltage follower amplifier 30 may need to drive a large capacitive load (e.g., 20 nanofarads) and also be able to cause $V_{OUT}$ to settle very rapidly to within a millivolt of the desired "steady state" value of $V_{OUT}$.

Above mentioned slew boost buffer circuit 22 includes N-channel input transistor M0, N-channel transistor M1, and P-channel transistor M2. The drain of input transistor M0 is connected to $V_{DD}$ and its gate is connected by input conductor 2 to receive input voltage $V_{IN}$. The source of input transistor M0 is connected by conductor 21 to the gate of transistor M1, the gate of transistor M2, and one terminal of a current source I3, the other terminal of which is connected to $V_{SS}$. The drain of transistor M1 is connected to $V_{DD}$.

The source of transistor M1 is connected by conductor 6 to the source of transistor M2, so the value of $V_F$ produced during a large, fast transition of $V_{IN}$ is applied to the gate of source follower transistor MP3 of current gain boosted follower circuit 12 and to one terminal of compensation capacitor C0. The drain of transistor M2 is connected $V_{SS}$. The W/L ratio (channel-width-to-channel length ratio) of source follower transistor MP3 preferably is selected so as to ensure that transistor MP3 operates in its weak inversion region.

In current gain boosted follower 12, pull-down transistor MN8 turns off when its gate voltage is sufficiently decreased. The constant bias voltage V1 on the gate of cascode transistor MN7 causes the current in cascode transistor MN7 to be substantially increased when the voltage on conductor 14 is decreased enough to turn pull-down transistor MN8 off, and also maintains a minimum current in pull-down transistor MN8. The level of bias voltage V1 and the sizing of cascode transistor MN7 and pull-down transistor MN8 determine that minimum current in pull-down transistor MN4. The current through resistor R2 is equal to sum of the currents through source follower transistor MP3 and cascode transistor MN7.

In FIG. 4, the gate-to-source voltage of transistor M0 is chosen as the "VGS" voltage drop between $V_{IN}$ and $V_F$ during large, fast transitions of $V_{IN}$. During steady state operation, both of transistors MP1 and MP2 are OFF, and buffer 22 does not affect the operation of input stage 17. During an input transient, one of transistors MP1 and MP2 is turned ON and quickly charges $V_F$ to a voltage close to the final value of $V_F$. Then the current through transistors M1 and M2 stops, and input stage 17 settles in a linear operating mode for fast-settling voltage follower amplifier 30.

Slew boost buffer 22 is operatively disconnected during steady state conditions because transistors M1 and M2 both are OFF. During a large, fast $V_{IN}$ transient, depending on whether the transient is increasing or decreasing, slew boost buffer 22 takes over and rapidly charges $V_F$ to a voltage that is either a VGS voltage drop above or below the desired "steady-state" value of $V_F$. During the transition of $V_{IN}$, and depending on whether the transition is positive-going or negative-going, either transistor M1 or transistor M2 is turned on. This rapidly charges or discharges $V_F$ to a voltage that is close to, i.e., to within a VGS voltage drop of, the desired steady-state value of $V_F$. If $V_{IN}$ causes transistor M2 to turn on rapidly, $V_F$ decreases rapidly until it turns transistor M1 on, which turns transistor M2 off. Similarly, if $V_{IN}$ causes transistor M1 to turn on rapidly, rapidly, $V_F$ increases rapidly until it turns transistor M2 on and turns transistor M1 off Slew boost buffer 22 therefore functions only during large, fast transitions of $V_{IN}$, and is in effect disconnected from the rest of voltage follower amplifier 30 as soon as $V_F$ has been rapidly charged to within a VGS voltage drop above or below the steady-state value of $V_F$. Then input stage 17 takes over and finishes charging $V_F$ to its desired steady-state value, and $V_{OUT}$ achieves its desired steady-state value equal to $V_{IN}$ by following $V_F$.

The settling time of voltage follower amplifier 30 output $V_{OUT}$ to essentially completely charge or discharge $C_{LOAD}$, which may be roughly 20 nanofarads, is limited mainly by the maximum charging or discharging current that pull-up transistor MP8 can supply or that pull-down transistor MN8 can sink. More specifically, the settling time for charging $V_{OUT}$ is determined by the current capability of current gain boosted follower 12 to charge up the load capacitance $C_{LOAD}$. Pull-up transistor MP8 helps with the charging, but it strongly "kicks in" to supply a large charging current in response to fast positive-going transients of $V_{IN}$ if the output voltage $V_{OUT}$ started to get pulled low when in fact this should not have occurred. That is, if a load profile is applied to output conductor 9 that starts pulling $V_{OUT}$ low, then the drain voltage of source follower transistor MP3 goes low. That turns pull-down transistor MN8 off, but the drain voltage of cascode transistor MN7 goes low, causing pull-up transistor MP8 to turn on very fast and pull $V_{OUT}$ very rapidly to a high level. This allows very good regulating of output voltage $V_{OUT}$ during fast transients and keeps ripple voltage components in $V_{OUT}$ to a minimum.

In one implementation, voltage follower amplifier 30, when driving a 20 nanofarad capacitive load $C_{LOAD}$, can cause $V_{OUT}$ to settle to within 1 millivolt of the desired voltage within roughly 2 microseconds in response to, for example, a 5 volt step increase or decrease with a step duration of approximately a few picoseconds. Voltage follower amplifier 30 also provides stable operation with any capacitive load greater than 1 nanofarad.

Figure 1:
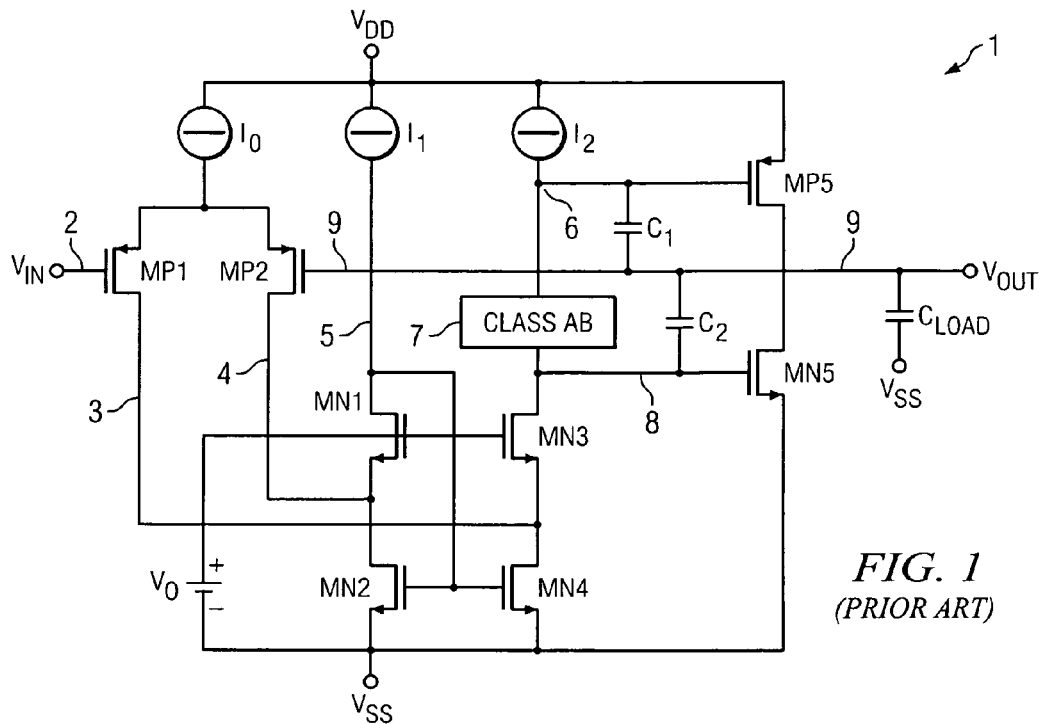
FIG. 1 is a schematic diagram of a prior art two-stage voltage follower circuit.

The shortcomings of the circuitry shown in Prior Art FIG. 1 and also in FIG. 2 thus are overcome by fast-settling voltage follower amplifier 30 of FIG. 4. This is achieved partly by using the single-stage voltage follower architecture of FIGS. 2 and 4 instead of the two-stage architecture shown in Prior Art FIG. 1, partly by using current gain boosted follower 12, and also by using feedforward slew boost buffer circuit 22 to bypass input stage 17 during fast settling of $V_F$ and $V_{OUT}$. An advantage of voltage follower amplifier 30 of FIG. 4 is that $V_{OUT}$ can settle very rapidly even with a very high-capacitance load, and another advantage is that this is achieved without increasing power consumption by providing more current into the input stage, since slew boost buffer 22 is essentially a zero-power circuit. Fast-settling voltage follower amplifier 30 of FIG. 4 may be especially useful for the above mentioned touchscreen applications, and also may be useful for many other applications.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the voltage follower circuit shown in FIG. 4 could be implemented using bipolar transistors instead of MOS transistors, but the slew boosting circuitry 22 would need to be more complex because of the high base current in a bipolar transistor, and base current cancellation techniques would be needed to make the slew boosting circuitry operate properly. Transistors MP1, MP2, MP3, MN2, and MN4 and current sources I1 and I2 could be implemented by means of bipolar transistors. Furthermore, the disclosed folded cascode operational amplifier input stage 17 could be replaced by an different kind of input stage such as a current mirror operational amplifier or a simple 2 stage operational amplifier. Also, a somewhat different input stage could be used, such as a current mirror operational amplifier. The gate of cascode transistor MN7 could be biased by something other than a voltage source.

Furthermore, resistor R1 and resistor R2 in FIG. 4 could be replaced by a current source, even though the resistor R2 makes the circuit more stable because resistor R2 lowers the impedance of the local feedback loop created between transistor MP3, resistor R2 and transistor MN8. Using a current source in place of each of resistors R2 and R1 would speed the response up somewhat, but would leave the loop vulnerable to instability. Resistor R2 helps lower the impedance at the gate of pull-down transistor MN8 and therefore improves stability at the cost of reducing circuit speed somewhat. If a current source is used in place of R2 and/or R1, then a compensation capacitance from the gate of pull-down transistor MN8 to $V_{SS}$ and/or a compensation capacitance is required from the gate of pull-up transistor MP8 to $V_{DD}$ would be necessary to make the loop stable.

Furthermore, instead of a using current gain boosted follower, one might choose to use a Class AB buffer as the output stage 12, with Class AB biasing being embedded within the folded cascade stage. A disadvantage of that technique is that it would introduce a second pole into the transfer characteristic of the voltage follower circuit that would make it slower than if the current gain boosted follower is used.

What is claimed is:

1. A voltage follower circuit for producing an output signal which follows an input signal, comprising:
   (a) an input stage having a first input for receiving the input signal, and a second input for receiving the output signal, the input stage generating a first signal indicative of a difference between the input signal and the output signal;
   (b) an output circuit having an input coupled to receive the first signal and also having an output on which the output signal is produced; and
   (c) a slew boost circuit including
       1) a first transistor having a control electrode for receiving the input signal, a first electrode coupled to a first current source, and a second electrode coupled to a first supply voltage,
       2) a second transistor having a control electrode coupled to the first electrode of the first transistor, a first electrode coupled to the first signal, and a second electrode coupled to the first supply voltage, and
       3) a third transistor having a control electrode coupled to the first electrode of the first transistor, a first electrode coupled to conduct the first signal, and a second electrode coupled to a second supply voltage.

2. The voltage follower circuit of claim 1 wherein the output circuit includes a current gain boost circuit including
1) a follower transistor having a control electrode coupled to receive the first signal and a first electrode for receiving the output signal,
2) a first resistive element coupled between a second electrode of the follower transistor and the second supply voltage,
3) a cascode transistor having a control electrode coupled to receive a first bias voltage, a first electrode coupled to the second electrode of the follower transistor and a control electrode of a pull-down transistor, and a second electrode coupled to a control electrode of a pull-up transistor and a second resistive device, and
4) the pull-up transistor having a first electrode coupled to the first supply voltage and a second electrode coupled to an output conductor connecting the output signal.

3. The voltage follower circuit of claim 2 wherein the input stage includes a first input transistor having a first electrode connected to a tail current source, a control electrode coupled to receive the input signal, and a second electrode coupled to a folded cascode circuit including fourth, fifth, sixth, and seventh transistors, a first electrode of each of the fourth and sixth transistors being coupled to the first supply voltage, a second electrode of the fourth transistor being coupled to the second electrode of the first input transistor and a first electrode of the fifth transistor, the input stage also including a second input transistor having a first electrode coupled to the tail current source, a control electrode coupled to the output signal, and a second electrode coupled to a second electrode of the sixth transistor and a first electrode of the seventh transistor, control electrodes of the fifth and seventh transistors being connected to a second bias voltage, control electrodes of the fourth and sixth transistors being coupled to a second electrode of the fifth transistor and a second current source, a second electrode of the seventh transistor being coupled to the first signal and a third current source.

4. The voltage follower circuit of claim 1 wherein the transistors are MOS (metal-oxide-semiconductor) transistors, the first electrodes are sources, the second electrodes are drains, and the control electrodes are gates.

5. The voltage follower circuit of claim 4 wherein the follower transistor, the pull-up transistor, and the first and second transistors, the cascode transistor, and the pull-down transistor are N-channel transistors, and wherein the second transistor is a P-channel transistor.

6. The voltage follower circuit of claim 1 the transistors are MOS (metal-oxide-semiconductor) transistors, the first electrodes are sources, the second electrodes are drains, and the control electrodes are gates, and wherein the first and second input transistors are P-channel transistors and the fourth, fifth, sixth, and seventh transistors are N-channel transistors.

7. The voltage follower circuit of claim 1 wherein the slew boost circuit operates to
1) shift the input signal and apply the shifted input signal to turn on one or the other of the second transistor and the third transistor, depending on whether a fast transition of the input signal is positive-going or negative-going, the second transistor having a conductivity type opposite to that of the third transistor,
2) cause the turned on second or third transistor to rapidly drive the first signal to an intermediate level close to a steady-state value of the first signal corresponding to a steady state value of the input signal at the end of the fast transition, and
3) turn off the turned on first or second transistor when the first signal reaches the intermediate level.

8. The voltage follower circuit of claim 7 wherein the slew boost circuit operates to shift the input signal by applying it to the control electrode of the first transistor to produce the shifted input signal on the control electrodes of the second and third transistors.

9. The voltage follower circuit of claim 7 wherein if the first signal undergoes a fast, positive-going transition, that turns the follower transistor off, the first resistive element causes the pull-down transistor to turn off and also causes the cascode transistor to turn on harder so as to turn the pull-up transistor on and rapidly increase the voltage of the output signal.

10. The voltage follower circuit of claim 7 wherein if the first signal undergoes a fast, negative-going transition, that turns the follower transistor on, the first resistive element causes the pull-down transistor to turn on and also reduces the amount of current in the cascode transistor so as to turn off the pull-up transistor and rapidly decrease the voltage of the output signal.

11. The voltage follower circuit of claim 3 wherein the input circuit includes a compensation capacitor coupled to the first signal.

12. The voltage follower circuit of claim 1 wherein the first resistive element includes a resistor.

13. The voltage follower circuit of claim 1 wherein the second resistive element includes a pull-up resistor.

14. A voltage follower circuit for providing fast settling of an output signal of a voltage follower circuit, comprising:
(a) a differential input stage having a first input for receiving an input signal, and a second input for receiving the output signal, the input stage generating a first signal indicative of a difference between the input signal and the output signal, and a current gain boosted follower circuit including an input coupled to receive the first signal and an output conductor for conducting the output signal;
(b) slew boost means having an input coupled to the first input of the differential input stage and an output coupled to an output of the differential input stage;
the slew boost means including:
1) a first transistor having a control electrode for receiving the input signal, a first electrode coupled to a first current source, and a second electrode coupled to a first supply voltage,
2) a second transistor having a control electrode coupled to the first electrode of the first transistor, a first electrode coupled to the first signal, and a second electrode coupled to the first supply voltage, and
3) a third transistor having a control electrode coupled to the first electrode of the first transistor, a first electrode coupled to conduct the first signal, and a second electrode coupled to a second supply voltage: and
(c) wherein the differential input stage drives the first signal from the intermediate level to a steady state value corresponding to a value of the input signal at the end of the fast transition.

* * * * *